United States Patent [19]
Cronin et al.

[11] Patent Number: 5,795,830
[45] Date of Patent: Aug. 18, 1998

[54] REDUCING PITCH WITH CONTINUOUSLY ADJUSTABLE LINE AND SPACE DIMENSIONS

[75] Inventors: John E. Cronin, Milton; Carter W. Kaanta, Colchester, both of Vt.

[73] Assignee: International Business Machines Corporation, Armonk, N.Y.

[21] Appl. No.: 686,481

[22] Filed: Jul. 26, 1996

Related U.S. Application Data

[63] Continuation of Ser. No. 469,111, Jun. 6, 1995, abandoned.

[51] Int. Cl.$^6$ .......................... H01L 21/3065; C03C 25/06
[52] U.S. Cl. ........................ 438/696; 438/712; 438/724; 438/757
[58] Field of Search ........................ 438/696, 712, 438/724, 757

[56] References Cited

U.S. PATENT DOCUMENTS

| | | |
|---|---|---|
| 3,997,367 | 12/1976 | Yau . |
| 4,083,098 | 4/1978 | Nicholas . |
| 4,287,661 | 9/1981 | Stoffel . |
| 4,432,132 | 2/1984 | Kinsbron et al. . |
| 4,559,693 | 12/1985 | Kamei . |
| 4,648,937 | 3/1987 | Ogura et al. . |
| 4,650,544 | 3/1987 | Erb et al. . |
| 4,685,198 | 8/1987 | Kawakita et al. . |
| 4,707,218 | 11/1987 | Giammarco et al. ............... 156/643 |
| 4,776,922 | 10/1988 | Bhattacharyya et al. ............ 156/643 |
| 4,820,654 | 4/1989 | Lee . |
| 4,903,108 | 2/1990 | Young et al. . |
| 4,994,400 | 2/1991 | Yamaguchi et al. . |
| 5,139,904 | 8/1992 | Auda et al. . |
| 5,292,689 | 3/1994 | Cronin et al. . |

FOREIGN PATENT DOCUMENTS

| | | |
|---|---|---|
| 60-223160 | 11/1985 | Japan . |
| 61-285723 | 12/1986 | Japan . |
| 61-285724 | 12/1986 | Japan . |
| 61-285725 | 12/1986 | Japan . |
| 61-285726 | 12/1986 | Japan . |
| 62-106456 | 5/1987 | Japan . |

OTHER PUBLICATIONS

Coe, "The Lateral Diffusion of Boron in Polycrystalline Silicon and its Influence on the Fabrication of Sub–Micron Mosts", Solid State Electronics V20, 1977, pp. 985–992.

Abbas, et al. "Extending the Minimal Dimesions of Photolithographic Integrated Circuit Fabrication Processing", IBM Technical Disclosure Bulletin V20 N4, Sep. 1977, pp. 1376–1378.

Miller, "High Density Planar Metal Lands", IBM Technical Disclosure Bulletin V23 N6, Nov. 1980, pp. 2270–2276.

Goth, et al., "Tighter Spacing of Metal Lines for Improved Density", IBM Technical Disclosure Bulletin V24 N2, Jul. 1981, pp. 1286–1287.

Tsang, "Method to Improve the Controllability of Lightly Doped Drain $SiO_2$ Spacer Formation", IBM Technical Disclosure Bulletin V24 N2, Jul. 1981 pp. 1293–1295.

Magso, et al., "Self–Aligned Metal Bipolar Process", IBM Technical Disclosure Bulletin V24 N10, Mar. 1982, pp. 5128–5131.

(List continued on next page.)

*Primary Examiner*—Thorl Chea
*Attorney, Agent, or Firm*—Whitman, Curtis, Whitham & McGinn; Howard Walter, Jr.

[57] ABSTRACT

A method of forming sub-lithographic elements and spaces therebetween where the pitch may be reduced with continuously adjustable line and space dimensions, and a structure resulting from the method, are disclosed. A plurality of spaced convertible members are formed on a substrate. A portion of each member is then converted, thereby reducing the dimensions of the unconverted portion of the member while increasing the width of the member plus its converted layer. A conformal layer of material is then deposited over the converted members, followed by directional etching of the conformal layer. The unconverted portion of the member is then removed. The line and space dimensions can be continuously adjusted by altering either or both of the member's converted layer and conformal layer.

14 Claims, 1 Drawing Sheet

OTHER PUBLICATIONS

Abbas, et al. "High Performance Lateral Bipolar Devices", IBM Technical Disclosure Bulletin V25 N8, Jan. 1983, pp. 4421–4422.

Jambotkar, "Submicrometer–Wide Polysilicon Resistors", IBM Technical Bulletin V25 N9, Feb. 1983, pp. 4785–4788.

De La Moneda, "Processes to Reduce and Control the P–Type Doping Concentration at the Boundary Between Recessed Oxide and Active Device Regions", IBM Technical Disclosure Bulletin V25 N11B, Apr. 1983, pp. 6131–6142.

Abbas, et al., "Formation of Sub–Micron Patterns with Negligible Tolerance", IBM Technical Disclosure Bulletin V26 N6, Nov. 1983, pp. 2732–2738.

Holland, et al., "Advanced Groundrule Processing Performed with Currently Available Photolithographic Tools", IBM Technical Disclosure Bulletin V29 N9, Feb. 1987, pp. 3928–3929.

Brady et al., "Nanostructures with Optical Lithography and Double Silylation" IBM Technical Disclosure Bulletin V32 N3B, Aug. 1989, pp. 381–382.

Bartush, "Submicron Insulation Thickness to Improve Contact Stud Density", IBM Technical Disclosure Bulletin V33 N4, Sep. 1990, pp. 233–234.

REDUCING PITCH WITH CONTINUOUSLY ADJUSTABLE LINE AND SPACE DIMENSIONS

This is a Continuation of application Ser. No. 08/469, 111, filed Jun. 6, 1995, now abandoned.

BACKGROUND OF THE INVENTION

1. Field of the Invention

The present invention generally relates to techniques for decreasing the pitch of processed technology elements and, more particularly, to a method of using sidewall spacer and insitu oxidation techniques to provide a continuously adjustable, precise, and scalable pitch reduction.

2. Description of the Prior Art

In many designs, pitch or line and space adjustments are made within the minimum design rules. The minimum pitch (line and space) for the generation of lines has to be greater than or equal to twice the minimum resolution of the exposure tool, since the exposure tool has to resolve the lines as well as the spacings. In other words, if the minimum design line dimension was 0.7 µm, then the minimum pitch of the device would be 1.4 µm–0.7 µm for the line and 0.7 µm for the space.

In order to make the line larger or the space smaller than the minimum dimensions, some have used overexposure or underdevelop techniques. As dimensions shrink, however, exposure wavelengths shrink, and it becomes harder to use the overexposure technique to adjust the images. Also, varying the exposure or developing resist images do not change the pitch, so other techniques are used to reduce the minimum pitch below the minimum image of the exposure tool.

One such technique is sidewall image transfer (SIT). In a conventional SIT process, the image size can be made smaller than that obtainable by conventional lithography by establishing a sidewall on the interior vertical surfaces of the opening in the lithographic mask used to obtain the image.

One example of a SIT process for the formation of dense metal lines begins with the deposition of spaced mandrels consisting of polysilicon or polyimide. Then a sidewall of nitride or silicon oxide is conformally deposited on the surface of the structures. The conformal films are then etched back, resulting in wider lines (formed by the original line mandrel width increased by the thickness of the etched sidewall oxide or nitride) and smaller spaces, called spacers (formed by the original space width reduced by the thicknesses of the etched sidewall oxide or nitride), compared to the original line and space dimensions.

Depending on. the application of the device being constructed, additional processing steps could include removing the mandrel by etching, thereby leaving only the sidewall oxide or nitride spacers. Thereafter, the appropriate metals or oxides may be selectively deposited utilizing suitable masks or etchants to achieve the desired structure or object of the semiconductor device.

With conventional SIT processes, however, there comes a point where either the line or space can not be varied producing a so-called "forbidden zone". Referring to FIG. 6, there is shown the minimum lithographic pitch $M_P$, which is equal to the minimum line width, $M_L$, plus the minimum space width, $M_S$. In order to achieve a smaller final space $F_S$, $M_S$ is filled and etched back producing two spacers of width S. The final space $F_S$ is thus $M_S$–2S in width. A forbidden zone refers to the situation where the designer seeks a final space $F_S$ with spacer widths not equal to S and/or not dependent on S directly. that is, the designer wants a minimum $F_S$, but with spacer widths larger or smaller than S. The only way to achieve such relationships would be to alter the width of $M_S$, which—in the case of spacer widths smaller than S—can not be done since $M_S$ is already as small as it can be due to the minimum resolution of the exposure tool.

In light of the foregoing, there exists a need for a method to enhance the imaging capability of SIT over a full range of structural dimensions where the pitch (line and space) may be reduced by continuously adjusting the line and space dimensions to enable greater line density for a given application.

SUMMARY OF THE INVENTION

The present invention is directed to a method and resulting structure that allows independent variation and adjustment of the line and space dimensions to reduce the pitch, or change the line or space within the forbidden zone, which substantially obviates one or more of the problems due to the limitations and disadvantages of the related art.

In accordance with the present method, the pitch (line and space) of any structure may be reduced by continuously adjusting the line and space dimensions to enable greater line density for a given application. This is generally accomplished by varying the mandrel conversion and conformal layer deposition steps and removing the unconverted portion of the mandrel.

To achieve these and other advantages and in accordance with the purpose of the invention, as embodied and broadly described, the invention provides for a method of forming sub-lithographic elements and spaces therebetween, the method comprising the steps of (1) forming a plurality of spaced convertible members on a substrate; (2) converting a portion of one or more of said plurality of members to reduce the width of an unconverted portion of the member; (3) depositing a conformal layer of material over vertical and horizontal surfaces of the plurality of members and said substrate; (4) directionally etching the conformal layer; and (5) removing the unconverted portions of the members.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
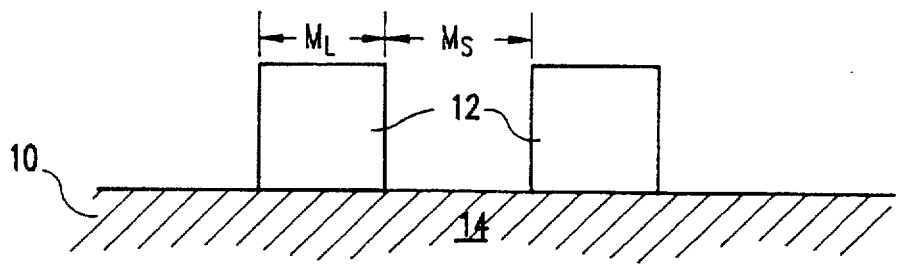
FIG. 1 is a cross-sectional view of mandrel line and space structures.

Referring now to the drawings, and more particularly to FIG. 1, there is shown a cross-section view of a semiconductor structure, designated generally as reference numeral 10. As embodied herein and referring to FIG. 1, the structure 10 includes a plurality of line mandrels 12, deposited on substrate 14 and spaced at a certain distance from each other as required. As discussed above, the combined space $M_S$ and line $M_L$ dimensions shown in FIG. 1 are referred to as the pitch of the device.

The mandrels 12 may be formed by any of the well known deposition and patterning techniques. By way of example and not by limitation, one processing technique would begin by depositing a layer of polysilicon on the substrate by Chemical Vapor Deposition (CVD). A resist film is then applied on top of the polysilicon. Conventional masking, exposure and developing techniques would form openings in the resist film. The exposed polysilicon can then be etched down to the substrate by Reactive Ion Etching (RIE) in a halogen-containing etchant gas such as $CF_4$. The remaining resist film would then be removed leaving a pattern of polysilicon mandrels.

It is understood that the mandrels need not be composed of polysilicon, and may be formed of other convertible materials, such as aluminum, copper, titanium, tungsten, etc., and be within the scope of this invention.

The method of the present invention involves the conversion of a portion of a mandrel member and then subsequently removing the unconverted portion. For polysilicon mandrels, well known conversion processes such as oxidation or ion implantation may be utilized in the practice of the invention. For the convertible metals described above, oxidation will generally be the conversion process utilized in the practice of the invention.

For simplicity and ease of discussion, the remaining disclosure will refer to a structure composed of polysilicon mandrels using an oxidation process. It is understood, however, that the present method and resulting structures may be performed using different mandrel materials and different conversion processes as described immediately above.

Figure 2:
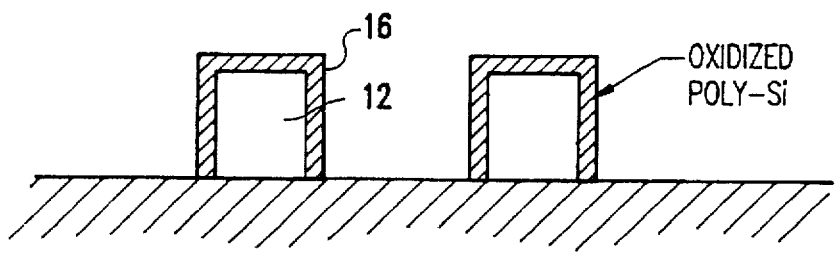
FIG. 2 is a cross-sectional view of the mandrel structures after conversion of the mandrel surface.

Returning to the drawings, after formation of the polysilicon mandrels, the exposed surfaces of the polysilicon are oxidized, resulting in an oxidized layer 16 on the exposed surfaces of the mandrel 12 as shown in FIG. 2. Suitable masks may be employed to oxidize only a portion of the mandrels. By way of example and not by limitation, the polysilicon mandrel would be dry oxidized at 900° C. for the time required to oxidize the amount needed. It is apparent that the parameters for forming the oxidized layer will depend on the particular underlying mandrel material, and such parameters can readily be ascertained by one of skill in the related art to which the present invention pertains.

As will be discussed further below, the duration of this oxidation step (and resulting thickness of the oxidized layer 16) may be varied to achieve the desired line and space dimensions. Oxidizing a portion of the mandrel has the effect of reducing the dimensions of an unoxidized portion of the mandrel 12 while increasing the overall width of the mandrel 12 plus its oxide layer 16.

Figure 3:
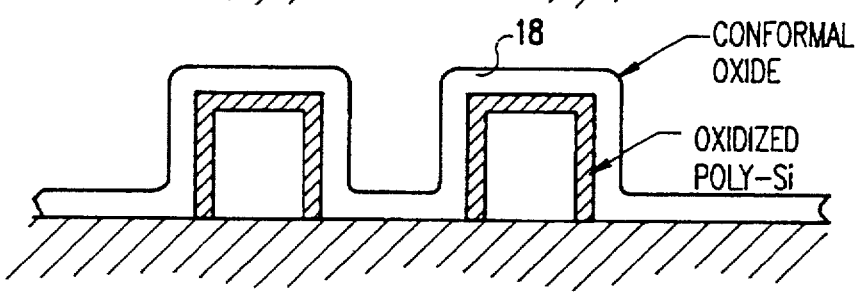
FIG. 3 is a cross-sectional view of a conformal layer deposited over the converted mandrel structure.

FIG. 3 illustrates the next step of the method which is the deposition of a conformal oxide 18 over the entire device, thereby covering the substrate, the horizontal and vertical surfaces of the oxidized polysilicon layer 16, and the spaces therebetween. The conformal oxide 18 can be any number of conformal oxidizable materials, for example, nitride or copper. The choice of the conformal oxide (or other suitable material) should be such that it has similar, if not better masking properties to the material beneath the mask to be etched.

While the above embodiment has been described with regard to the combination of an oxidized polysilicon layer 16 and conformal oxide layer 18, other low temperature material combinations are considered to be within the scope of this invention. What is important is that the combination of the mandrel material (and resulting mandrel oxidized layer) and the conformal layer material be selected so as to create oxide spacers and be able to remove the original mandrel material 12 without impacting the mandrel oxidized layer 16 or the oxide spacers 18.

Figure 4:
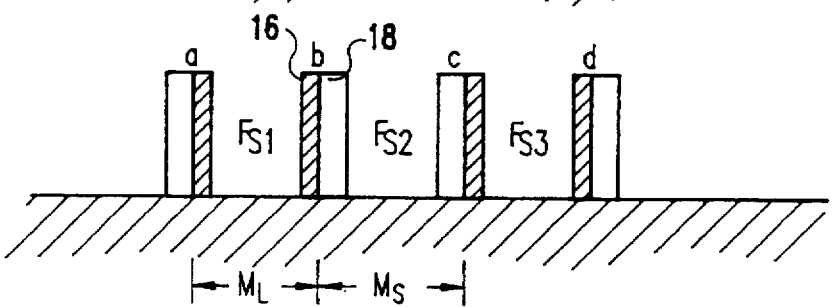
FIG. 4 is a cross-sectional view of new line and space dimensions after the conformal layer etch and mandrel etch according to the present invention.

Continuing with the present method, after deposition of the conformal oxide, the oxide layer 18 is then dry etched back directionally using RIE. The polysilicon mandrel 12 is then etched back by a wet etch. The resulting structure is depicted in FIG. 4, showing the oxidized polysilicon layer 16 and conformal oxide layer 18 forming an exemplary pattern defined by mandrels a, b, c, and d, and final spaces $F_{S1}$, $F_{S2}$, and $F_{S3}$.

By varying the conformal oxide deposition or mandrel oxidization steps of the present inventive method, the final line or space of a final device may be adjusted, not limited by the conformal oxide alone.

Figure 5:
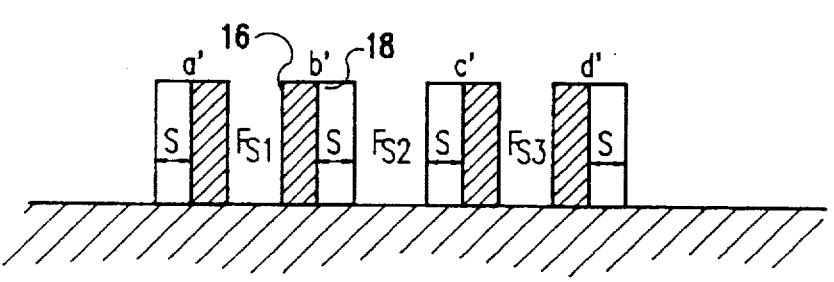
FIG. 5 is a cross-sectional view of an alternate line and space configuration produced according to the method of the present invention.
Figure 6:
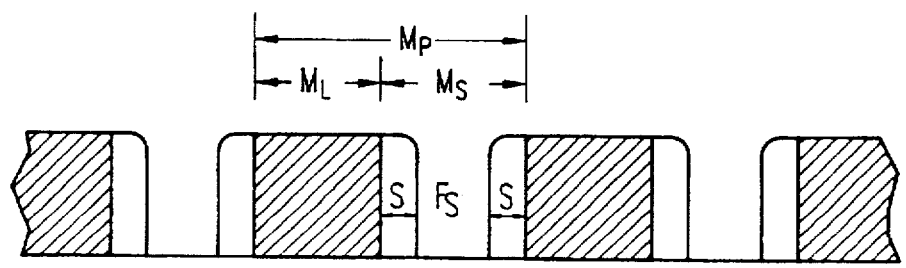
FIG. 6 is a cross-sectional view of conventional line and space dimensions resulting from a SIT process.

For example, to achieve a smaller final space within the minimum space width $M_S$, the amount of conformal oxide 18 deposited (see FIG. 3) may be varied to achieve a structure as shown in FIG. 5. With the thicker layer of conformal oxide 18 forming the resulting spacers "S", it can be seen that the width of $F_{S2}$ in FIG. 5 is smaller than the width of $F_{S2}$ in FIG. 4.

Equally as important, however, is that by utilizing the present inventive method, a designer is able to achieve smaller spaces within the minimum line width $M_L$. This is accomplished by varying the thickness of oxidized polysilicon 16 formed as in FIG. 2, and then wet etching the unoxidized portion of the polysilicon mandrel. The unoxidized portion of the mandrel that is removed thus becomes the space.

As shown in FIG. 5, the thicker oxidized layer 16 creates final spaces $F_{S1}$ and $F_{S3}$ that are smaller than those of FIG. 4, independent of the thickness "S" of the conformal oxide layer 18. The designer, therefore, has independent control of $M_L$, that is, the designer has the ability to achieve a desired final space $F_S$ without being constrained by the conventional SIT relationship of $F_S = M_S - 2S$.

It is apparent that numerous and varied line and space dimensions can be created within the minimum line dimension $M_L$ by adjusting the mandrel oxidization step accordingly, even in the forbidden zone, since final spaces can be created independent of the width of the conformal oxide layer 18.

It can also be seen that mandrels a', b', c', and d' in FIG. 5 are wider than those of FIG. 4. Therefore, by choosing the proper oxidized layer 16 and conformal oxide layer 18 thicknesses, the line and space can be continuously adjusted to reduce the pitch. Moreover, the designer has unparalleled freedom to provide for any combination of lithographic and sub-lithographic dimensioned lines, with lithographic or sub-lithographic dimensioned spaces therebetween.

The patterns generated by any of the numerous combinations resulting from altering the oxidation and conformal oxide deposition steps are then transferred to the underlaying substrate, and by using conventional metalization or oxide deposition techniques, are used to achieve the object of the semiconductor device.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A method of forming a pattern having any combination of lithographic and sub-lithographic lines, with lithographic or sub-lithographic dimensioned spaces therebetween on a substrate, the method comprising the steps of:

forming a plurality of spaced convertible mandrels on a substrate wherein a substrate surface is exposed between said spaced mandrels, and wherein said convertible mandrels each have a width, vertical side mandrel surface portions, and an upper horizontal mandrel surface portion;

converting said vertical side mandrel surface portions and said upper horizontal mandrel surface portion of one or more of said plurality of convertible mandrels to form a converted portion layer including vertical wall portions and a horizontal portion located over an unconverted mandrel portion of each of said one or more mandrels, and said unconverted mandrel portion has a width less than said convertible mandrel width;

depositing a conformal layer of material over said substrate surface, and said vertical wall portions and said horizontal portion of said converted portion layer;

directionally etching said conformal layer to remove said conformal layer material portion where located on said horizontal portion of said converted portion layer and where located on said exposed substrate;

removing said unconverted portions of said mandrels to provide spaced composite vertical wall structures on said substrate, wherein said composite vertical wall structures each comprise one of said vertical wall portions of said converted portion layer adjoining a wall portion comprised of nonetched conformal layer material.

2. A method as recited in claim 1, wherein the mandrels are composed of a material selected from the group consisting of polysilicon and oxidizable metals.

3. A method as recited in claim 2, wherein the converting step for polysilicon mandrels is performed by partial oxidation of exposed surfaces of the mandrels.

4. A method as recited in claim 1, wherein the converting step is performed by partial oxidation of exposed surfaces of the mandrels.

5. A method as recited in claim 2, wherein the oxidizable metal is selected from the group consisting of polysilicon, aluminum, copper, titanium, and tungsten.

6. A method as recited in claim 1, wherein the widths of the converted and unconverted portion of the mandrels may be varied by varying a duration of the converting step.

7. A method as recited in claim 3, wherein the oxidized portion is produced by dry oxidation at approximately 900° C.

8. A method as recited in claim 1, wherein the conformal layer of material has different etch characteristics than that of the unconverted portion of the mandrels.

9. A method as recited in claim 8, wherein the conformal layer of material is selected from the group consisting of nitride and copper.

10. A method as recited in claim 1, wherein a combined width of the conformal layer and a converted portion of said mandrels form line, said lines having at least one of a lithographic and sub-lithographic dimension, and wherein the spaces between said lines have one of a lithographic and sub-lithographic dimension.

11. A method as recited in claim 10, further including the step of independently controlling the dimensions of said lines and said spaces therebetween.

12. A patterned structure formed on a substrate having any combination of lithographic and sub-lithographic lines, with lithographic or sub-lithographic dimensioned spaces therebetween on the substrate produced by the method of claim 1.

13. A method as recited in claim 1, wherein said step of directionally etching comprises RIE.

14. A method as recited in claim 1, wherein said step of removing said unconverted portions of said mandrels comprises wet etching.

* * * * *